United States Patent
Freyman et al.

[11] Patent Number: 5,985,695
[45] Date of Patent: Nov. 16, 1999

[54] METHOD OF MAKING A MOLDED FLEX CIRCUIT BALL GRID ARRAY

[75] Inventors: Bruce J. Freyman, Tempe; Robert F. Darveaux, Higley, both of Ariz.

[73] Assignee: Amkor Technology, Inc., Chandler, Ariz.

[21] Appl. No.: 09/141,928

[22] Filed: Aug. 28, 1998

Related U.S. Application Data

[62] Division of application No. 08/637,578, Apr. 24, 1996, Pat. No. 5,859,475.

[51] Int. Cl.$^6$ ........................................ H01L 23/48
[52] U.S. Cl. .......................... 438/112; 438/122; 438/613; 257/668; 257/675
[58] Field of Search ................... 438/613, 112, 438/122; 257/668, 667, 688, 738, 710, 788, 675, 706, 713, 717; 29/841

[56] References Cited

U.S. PATENT DOCUMENTS

| | | | |
|---|---|---|---|
| 5,045,921 | 9/1991 | Lin et al. | 357/74 |
| 5,133,495 | 7/1992 | Angulas et al. | 228/180 |
| 5,170,328 | 12/1992 | Kruppa | 361/398 |
| 5,203,075 | 4/1993 | Angulas et al. | 29/830 |
| 5,261,155 | 11/1993 | Angulas et al. | 29/830 |
| 5,355,283 | 10/1994 | Marrs et al. | 361/760 |
| 5,376,588 | 12/1994 | Pendse | 437/211 |
| 5,397,921 | 3/1995 | Karnezos | 257/779 |
| 5,409,865 | 4/1995 | Karnezos | 437/210 |
| 5,420,460 | 5/1995 | Massingill | 257/693 |
| 5,477,082 | 12/1995 | Buckley, III et al. | 257/679 |
| 5,506,756 | 4/1996 | Haley | 257/693 |
| 5,581,122 | 12/1996 | Chao et al. | 257/691 |
| 5,654,243 | 8/1997 | Yoneda et al. | 29/840 |
| 5,661,086 | 8/1997 | Nakashima et al. | 257/668 |
| 5,674,785 | 10/1997 | Akram et al. | 438/15 |
| 5,701,032 | 12/1997 | Fischer et al. | 257/692 |
| 5,705,851 | 1/1998 | Mostafazadeh et al. | 257/675 |
| 5,708,567 | 1/1998 | Shim et al. | 257/675 |
| 5,732,465 | 3/1998 | Tokita et al. | 29/841 |
| 5,852,870 | 12/1998 | Freyman et al. | 29/841 |
| 5,854,741 | 12/1998 | Shim et al. | 257/676 |
| 5,905,633 | 5/1999 | Shim et al. | 257/713 |

FOREIGN PATENT DOCUMENTS

| | | | |
|---|---|---|---|
| 0 408 101 A2 | 1/1991 | European Pat. Off. | 21/60 |
| 0 657 921 A1 | 6/1995 | European Pat. Off. | 21/56 |
| 0 664 562 A1 | 7/1995 | European Pat. Off. | 21/56 |
| 296 21 837 | 2/1997 | Germany . | |
| 8-107127 | 4/1996 | Japan . | |
| 89 10005 | 10/1989 | WIPO | 23/50 |

OTHER PUBLICATIONS

Hattas, D., et al., "Mounting Technology of GBA–P and GBA–T", 17th IEEE/CPMT Int'l Electronics Manufacturing Technology Symposium, Austin, Oct. 2–4, 1995, IEEE, pp. 417–421, XP000580510.

(List continued on next page.)

*Primary Examiner*—Donald L. Monin, Jr.
*Assistant Examiner*—Michael Dietrich
*Attorney, Agent, or Firm*—Skjerven, Morrill, MacPherson, Franklin & Friel LLP

[57] ABSTRACT

A grid array assembly method uses a flex circuitry substrate and includes providing a series of conforming flex circuitry substrates, the flex circuitry substrates include bonding pads and metallization on a first surface and, holes or vias in the substrate which define a contact pad array on the opposite surface. The substrates are tested and acceptable, then mounted on a carrier strip with longitudinally aligned apertures. The carrier strip is typically a metal such as copper. The strip with mounted substrates is then passed to a station where an IC die is mounted on the substrate first surface, wire bonds are placed from the die to the bonding pads, and the assembly is encapsulated by auto-molding to form a package body. Subsequently, interconnecting bumps are placed on the contact pads and the assembly is removed from the strip.

26 Claims, 4 Drawing Sheets

OTHER PUBLICATIONS

Karnezos, M., et al. "Flex Tape Ball Grid Array", 1996 Proceedings of 46th Electronic Components and Technology Conf., May 28–31, 1996 IEEE, pp. 1271–1277, XP000684990.

Schueller, Ph.D., R.D., "Design Considerations for a Reliable Low Cost Tape Ball Grid Array Package", 3M Electronic Products Division, Published in Proceedings fo IEPS Conference, San Diego, CA, Sep. 1995, pp. 1–14.

Schuller, R.D., "Design Conciderations for a Reliable Low Cost Tape Ball Grid Array Package", International Journal of Microcircuits and Electronic Packaging, Vo. 19, No. 2, Apr. 1996, pp. 146–154, XP000639477.

METHOD OF MAKING A MOLDED FLEX CIRCUIT BALL GRID ARRAY

This application is a divisional of application Ser. No. 08/637,578, filed Apr. 24, 1996, now U.S. Pat. No. 5,859, 475, entitled: Molded Flex Circuit Ball and Array and Method of Making.

RELATED APPLICATIONS

This application is related to commonly assigned U.S. patent application Ser. No. 08/214,339 filed Mar. 16, 1994, now U.S. Pat. No. 5,635,671 in the name of Bruce J. Freyman et al. and the commonly assigned and concurrently filed U.S. patent application Ser. No. 08/637,877, filed Apr. 24, 1996 in the name of Bruce J. Freyman, John Briar and Jack C. Maxcy and entitled Grid Array Assembly and Method of Making, the disclosure of which concurrently filed application is incorporated herein by reference.

BACKGROUND OF THE INVENTION

1. Field of the Invention

This invention relates to a method of making packaged grid array assemblies including integrated circuit chips or dies. More particularly, the invention relates to a method which yields a ball grid array incorporating a flexible circuit substrate which can be manufactured reliably and at a low cost.

2. Related Art

As integrated circuits have become more complex, a need has arisen for a packaged integrated circuit having a large number of high density, reliable external package connections It is also desirable to include in a packaged integrated circuit one or more conductive layers for signal routing and provision for ground and power metallization traces. To meet these needs, the ball grid array has been developed as illustrated in FIG. 1 of the commonly assigned related application Ser. No. 08/214,339 filed Mar. 16, 1994 in the name of Bruce J. Freyman et al.

A typical prior art ball grid array includes a semiconductor die, referred to herein as an integrated circuit (IC) or chip, attached to a die attach surface on a printed circuit board (PCB) with adhesive. Electrically conductive bond pads on the die are connected by electrically conductive bond wires to electrically conductive traces and/or electrically conductive regions formed on or adjacent to the die attach surface of the PCB substrate. Electrically conductive vias are then formed through the substrate from the traces and/or regions on the die attach surface to a mounting surface of the PCB substrate which is opposite the die attach surface. The electrically conductive traces formed on the mounting surface extend to solder pads formed on the mounting surface. Solder bumps are formed on each of the solder pads. The solder bumps are later reflowed to attach the BGA package to another electronic component such as a PCB mother board. An encapsulant such as plastic is formed to enclose the semiconductor die, the bond wires, and a portion of the die attach surface of the substrate, including most of the traces and/or regions. The vias are shown outside the encapsulant in FIG. 1 of the commonly assigned application Ser. No. 08/214,339, however, in other embodiments the vias can be inside the encapsulant. The encapsulant is frequently formed by injection or transfer molding or by other well known molding methods and equipment to form the encapsulant over the die in a ball grid array. Liquid (glop top) encapsulant also can be used.

Currently, molded plastic ball grid array packages are the least expensive method of producing a ball grid array style semiconductor package. In the prior art, the most expensive component of the ball grid array package is the substrate, which as discussed above, is typically a laminated glass fiber material such as printed circuit board (PCB).

In an effort to reduce the cost of plastic ball grid array packages, a good deal of research has been directed towards investigating alternative substrate materials to replace the relatively expensive PCB substrates. One promising material for replacing PCB substrates is a polyimide film with metal traces and/or bonding positions formed on the polyimide film. The combination of polyimide film with metal traces is referred to in the art as a flexible circuit or flex circuitry. The metal traces of the flex circuitry are typically formed by either applying a laminated copper foil to the polyimide film and etching to define the conductors (subtractive process) or by vacuum depositing copper directly onto the polyimide film followed by pattern plating (additive process).

Flex circuitry is typically fabricated into a ball grid array substrate by two different approaches. In the first approach, the flex circuitry is fabricated into a ball grid array substrate by pre-applying the metal, such as copper, on both sides of the polyimide film. Once the metal is deposited, standard drilling, punching, or etching techniques, well known to those of skill in the art, are used to form vias through the flexible circuitry. Once the vias are formed, standard photodelineation techniques are employed to produce the desired metallization pattern, including metal traces and bonding locations. A flex circuitry substrate created by this first approach is identical in format to the printed circuit board substrates currently used with plastic ball grid arrays. However, there is the critical difference in that the circuits and traces are formed on the flexible polyimide film rather than a glass-reinforced printed circuit board laminate.

Using this first approach of forming a flex circuitry substrate, the upper surface of the substrate contains a metal pattern that is used for mounting the die and wire bonding the die to the substrate. The electrically conductive vias conduct the electrical signals from the upper surface of the flex circuitry substrate to the circuit pattern on the lower surface of the flex circuitry substrate. The circuit pattern on the bottom of the flex circuitry substrate carries the electrical signals from the via to an array of metal terminations, usually solder balls, which are attached to pre-determined locations on the bottom of the flex circuitry substrate.

In the second approach to using flex circuitry to form a ball grid array substrate, the flex circuitry is formed with the metal circuit and trace patterns formed only on the upper surface of the flexible polyimide film. Using this second approach, the metal pattern formed only on the upper surface of the flexible film is used for chip mounting and wire bonding the chip to the circuit. The circuit pattern typically includes an array of round copper features outside of the wire bond pad. The backside of the copper film on these round metal features is then exposed by holes in the flexible film which can be formed by etching, drawing, punching, or other techniques well known to those of skill in the art.

Using this second approach of forming a flex circuitry substrate, the back side of the copper film is then used as a surface for the attachment of solder balls during the assembly of the plastic ball grid array package.

One advantage of forming a plastic ball grid array package using a flex circuitry substrate is that the flex circuitry substrate can be made in a reel-to-reel format in very high volume. Consequently, flex circuitry substrates have the potential to be a lower cost substrate then the printed circuit board substrates in current use. Another advantage of flex circuits is that they offer the capability to produce finer metal conductor patterns. For flex circuits that use an additive process to form the conductors, wire bonding fingers can be placed more closely together compared to conventional subtractive printed circuit board substrates. This allows more interconnections to the IC chip per unit area, which reduces cost.

Unfortunately, there are several problems associated with using flex circuitry substrates for plastic ball grid array manufacturing. First of all, the flex circuitry is very difficult to handle in a factory environment, i.e. in a mass production environment, because flex circuitry substrates lack the rigidity necessary for automated manipulation in mass production assembly lines.

In addition, the flex circuitry substrates that are formed using the first approach described above, i.e. the flex circuitry substrates that have metal traces on both surfaces and are molded in the same format as printed circuit board substrates, have a high warpage factor and exhibit poor solder ball co-planarity. This is because flex circuitry substrates typically warp during the curing of the mold compound used to encapsulate the ball grid array. This problem is particularly significant with newer generations of chips because the number of elements present on newer integrated circuit chips requires more connections between the integrated circuit chip package and the mother board and, as a result of the increased number of necessary connections, it is becoming more and more important that the solder balls making the external connection have a high degree of co-planarity, i.e., the solder balls all have the same height. In the prior art, the problems of warpage and decreased co-planarity were avoided because standard, i.e. printed circuit board, substrates have the requisite rigidity and have relatively low warpage levels. Consequently, the same flexibility that allows flex circuitry to be made in a reel-to-reel format causes warping problems further along in the processing.

The warping and special handling/processing problems associated with flex circuitry ball grid array substrates has prevented this highly advantageous substrate production technique from gaining widespread acceptance in the packaging industry.

What is needed is a method for creating plastic ball grid arrays incorporating flex circuitry substrates that allows a ball grid array package with a flex circuitry substrate to be manufactured using standard manufacturing equipment and techniques known in the industry, and yet, does not exhibit the high warpage and poor solder ball co-planarity problems currently associated with flex circuitry substrates.

SUMMARY OF THE INVENTION

According to the present invention, the handling and warping problems associated with flex circuitry ball grid array substrates is solved using the "strip carrier" concept set forth in commonly assigned U.S. application Ser. No. 08/637;877 filed Apr. 24, 1996 in the name of Bruce J. Freyman et al. as set forth under the concurrently filed Related Application. According to the principles of the invention, the flex circuitry substrates are attached to the periphery of a series of spaced apertures in a carrier strip of a stiffness greater than the flex circuitry substrates and firmly held in position overlying the carrier strip apertures. According to the principles of the invention, the carrier strip provides a support for the flex circuitry substrate and thereby reduces or eliminates the amount of warping during processing.

The flex circuitry substrates can be attached to the carrier strip in either a multi-unit strip or single unit format. One process for attaching the circuits to the strip is now outlined. (1) adhesive is applied to the carrier strip. The adhesive may be applied by spraying, lamination, or screen printing, or other methods known to those skilled in the art. The adhesive may be in the form of a double sided tape, which has a layer of adhesive on either side of a thin (0.025 to 1.25 mm) polyimide tape. Adhesives include epoxies, modified acrylates, and pressure sensitive adhesives (PSAs). (2) The flex circuitry is fed from a reel and singulated into individual units or strips of units. At this point after testing, defective circuits can be discarded. (3) The circuit is precisely aligned to the frame using tooling holes or a vision system, or other technique known by those skilled in the art. (4) The circuit is laminated to the frame using pressure and heat, if necessary, depending on which adhesive material is selected. The lamination process is optimized to give a bond with adequate strength to maintain high reliability over the life of the product.

Regarding material selection, it is important that the coefficient of expansion properties of the flex circuit are closely matched to those of the carrier strip. This ensures that the laminated assembly will remain flat during all of the subsequent temperature excursions in the IC packaging process; i.e., die bonding, wire bonding, molding, solder bumping. For example, if the carrier strip is made of a metal such as nickel-plated steel, stainless steel, copper, or brass which have a thermal coefficient of expansion (TCE) in the range of 12 to 18 ppm/° C., then the polyimide flex circuit film should be DuPont Kapton E or an Upe Upilex, which also have TCE values in the range of 12 to 18 ppm/° C. Alternatively, if DuPont Kapton H (TCE=20 to 40 ppm/° C.) is chosen for the flex circuit, then the carrier strip should be made of aluminum (TCE-24 ppm/° C.) or a rigid high temperature plastic. The strip carrier then provides support for the flex circuitry to simplify handling during the processing required to produce the ball grid array assembly. In this manner, the problems of the flex circuitry substrate warping during the curing of the encapsulant material is solved.

Another key attribute of the carrier strip and flex circuitry assembly according to the principles of the invention is that a very low cost flex circuitry substrate can be used for the assembly of ball grid arrays and that by employing a non-conductive adhesive to attach the flex circuitry to the metal strip carrier, there is no requirement to use a solder mask layer on the flex circuit substrate as is required with prior art PCB substrates. Additionally, the non-conductive adhesive insulates the exposed metal conductors on the top surface of the flex circuitry substrate from the metal carrier strip.

After the strip carrier-flex circuitry substrate assembly according to the principles of the invention has been die-attached, wire bonded, molded, and solder bumped, the resulting ball grid array packages are separated from the strip carrier by punching or other methods well known to those of skill in the art. The portion of the metal strip carrier that extends from the outside edge of the mold cap to the outside edge of the finished package remains attached to the flex circuitry substrate. This metal portion of the package acts as a stiffener to reduce warpage and also increases the thermal performance of the package by providing additional thermally conductive surface area exposed outside the package.

In one implementation of the method of making a grid array assembly according to the principles of the invention, an elongated carrier strip having a series of spaced aligned apertures extending longitudinally along the strip is provided. In addition, a flexible film having a die attach area and metallization, including bonding pads on at least a first surface of the film, is also provided. Adhesive is applied to the carrier strip. The flex circuitry is fed from a reel and singulated into individual units or strips of units, and defective circuits can be discarded. The circuit is precisely aligned to the frame and laminated using pressure and heat; if necessary. The resultant carrier strip, with tautly mounted film, is then transported into a grid array assembly packaging line where an integrated circuit die, including die conductive pads, is mounted on the die attach area of the film. Bonding wires are then formed from the die conductive pads to each of the film bonding pads. The die conductive pads and a portion of the film overlapping the aperture in the carrier strip is then encapsulated with an epoxy or plastic mold material. Interconnection bumps are then formed on one surface of the metallization on the flexible film. Then the grid array assembly, including the film and the die, are removed from the carrier strip In one implementation of the invention, the film is attached to a 360° peripheral lateral edge surrounding at least one aperture of the carrier strip.

In this embodiment of the invention, the plastic film can be a strip of plastic film having a series of printed circuits separated by a longitudinal spacing which corresponds to the spacing of the carrier strip aligned apertures. In this embodiment of the invention, the marginal edges of each of the flex circuits is attached to the respective lateral edges of the series of carrier strip apertures.

In another embodiment of the invention, the encapsulating step includes providing a mold die which includes a molding cavity and a molding runner. The mold die is closed and clamped over a molding cavity and the molding runner on a peripheral surface of the carrier strip overlying the film portion. Then a hardening molding compound is transferred into the molding cavity, around the die, around the wire bonds, and onto the film portion. The hardening molding compound is then hardened and the mold die is un-clamped and opened to remove the molding runner from the strip carrier.

In one embodiment of the invention, the individual ball grid array units are singulated from the carrier strip. In this embodiment of the invention, the singulating step can include an outer periphery of the flex circuit and an inner periphery of the carrier strip around the strip apertures.

In one embodiment of the invention, each of the interconnection bumps is a solder ball.

DETAILED DESCRIPTION

According to the invention, a substrate-based packaged electronic device, such as a ball grid array including an IC die, is produced by a molding process.

A series of conforming (the same) flex circuity substrates (also referred to herein as substrates) are manufactured which include suitable conductive traces (metallization), an IC die attach area(s), wire bonding pads formed on one surface of a flexible film such as polyimide, and an array of contact pads formed on an opposite surface of the flexible film. In one embodiment of the invention, conductive vias extend from the metallization on the one surface of the film to the contact pads formed on the opposite surface of the film.

According to the principles of the present invention, the flex circuity substrates are formed either singly or in strips. Following manufacturing, the flex circuity substrate units are tested to ensure that each substrate meets a prescribed detailed performance specification. Any substrate not meeting the specification is rejected.

According to the principals of the invention, adhesive is applied to the carrier strip, the flex circuitry is fed from a reel and singulated into individual units or strips of units, and defective circuits can be discarded. The circuit is precisely aligned to the frame and laminated using pressure and heat, if necessary.

The carrier strip is typically made of a strong, semi-flexible web of copper, stainless or other steel, or other material stock, with a thickness of from about 0.2 mm to about 1.0 mm. Consequently, the carrier strip provides support for the flex circuity substrate during the remainder of the ball grid array assembly process.

A typical adhesive used with the invention is epoxy, modified acrylate, or pressure sensitive adhesive (PSA).

According to the principles of the invention, the carrier strip is compatible with all the subsequent ball grid array (BGA) manufacture and assembly steps. As discussed above, each carrier strip has a series of spaced apertures over which a single flex circuity substrate is attached. Thus, the invention specifically allows for standard automated processing and auto-molding of each flex circuity substrate in the carrier strip.

Figure 1:
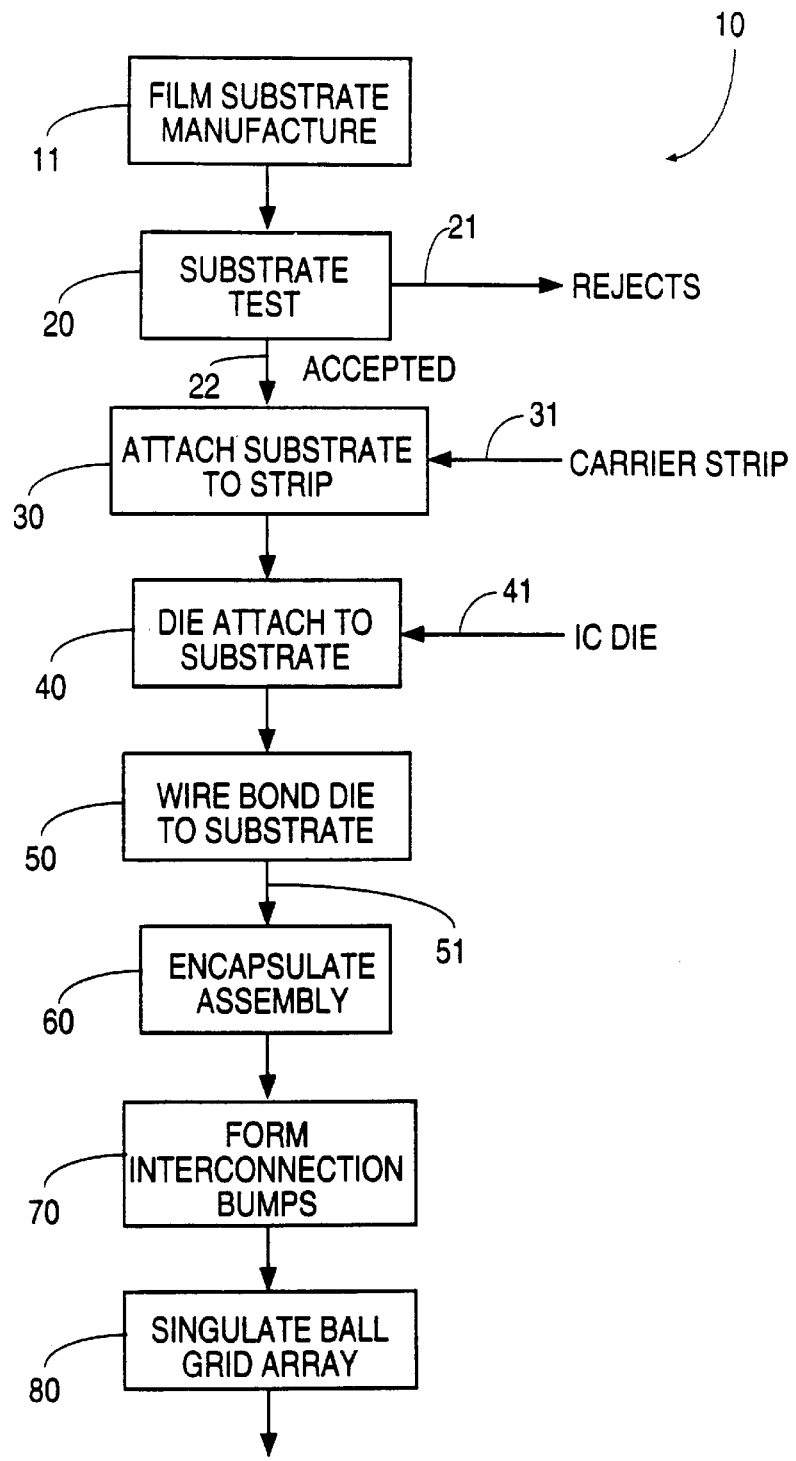
FIG. 1 is a block flow diagram of the method according to an embodiment of the invention for forming a grid array assembly.

FIG. 1 is a diagram of a process 10 according to an embodiment of the invention for forming a grid array.

In step 11 the flex circuity substrate is manufactured with prescribed metallization including patterned conductive traces of copper or the like, die attach areas, conductive bonding pads, and, in one embodiment, conductive vias which extend from metallization on one surface of the substrate to the opposite surface of the substrate.

Figure 2A:
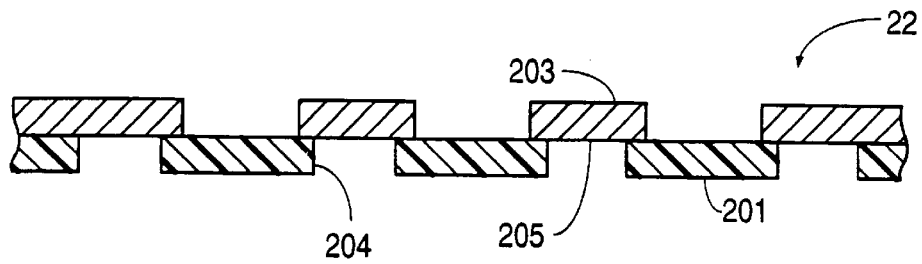
FIGS. 2A and 2B are cross sectional views of a substrate which show steps in the process of manufacturing the ball bonds in one embodiment of the invention.
Figure 2B:
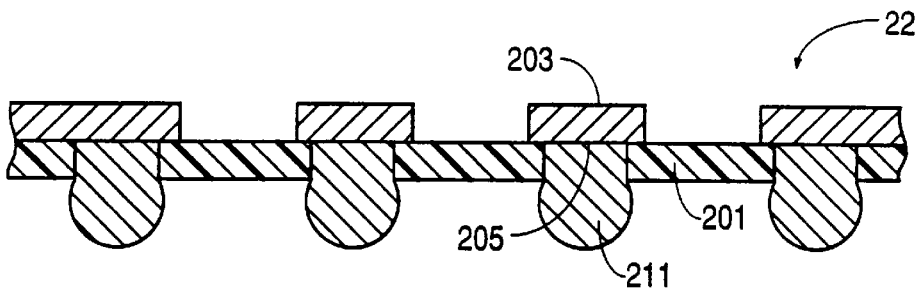

The flex circuity substrates are formed by methods outlined in the "Summary of the Invention" portion above. These substrates can be manufactured in various ways that are known to those skilled in the art. A typical structure 22 is shown in FIG. 2A. A polyimide film 201 has copper metallized circuitry 203 on one surface. Holes 204 in the film form contact pads 205. After the IC assembly process, these contact pads will be used for solder ball attachment. Shown in FIG. 2B is a substrate after solder balls 211 have been attached.

Once flex circuitry substrates such as flex circuitry substrate 22 (FIG. 2A) are formed, each flex circuitry substrate is tested in step 20 (FIG. 1) to the prescribed performance specification and those substrates not meeting the specification become rejects 21. Those substrates meeting the specification are designated accepted flex circuitry substrates 22.

In step 30, adhesive is applied to the carrier strip 31. The flex circuitry is fed from a reel and singulated into individual units or strips of units, and defective circuits can be discarded. The circuit is precisely aligned to the frame and laminated using pressure and heat, if necessary.

In step 40, integrated circuit dies or chips 41 are attached to each accepted flex circuitry substrate 22 in a die attach area (not shown) using conventional methods and materials such as epoxy, acrylic, or polyimide adhesives.

In step 50 the mounted die 41 is wire bonded or otherwise connected to bonding locations (not shown) on flex circuitry substrate 22 to form an assembly 51.

As discussed in more detail below, in step 60, assembly 51, and particularly die 41 and the wire bonds, are encapsulated to enclose die 41 and at least a peripheral portion of flex circuitry substrate 22 which encircles the die attach area. A two-piece mold die (FIG. 6) having a cavity, shaped generally to conform to the to-be-molded shape of the finished BGA package, is positioned against the peripheral edges of the carrier strip aperture and encapsulant, typically epoxy resin or other plastic, is transferred into the mold cavity through a mold runner area on the mold die and along carrier strip 31 until the cavity is filled.

The encapsulant flows around die 41, and the wire bonds, and adheres to the interior portions of flex circuitry substrate 22 including the metallization surrounding the die attach area. When the encapsulant hardens, the mold die is removed or opened. Excess encapsulant (bleed) is typically formed on the surface of carrier strip 31 in this process. However, since carrier strip 31 is typically copper or another metal, the bleed encapsulant poorly adheres thereto and is easily removed in a later step by exerting a torquing or tensile force on the mold runner attached to carrier strip 31. Consequently, excess encapsulant typically peels fairly cleanly from carrier strip 31 and the package without pulling any of the desired package encapsulant away from flex circuitry substrate 22 nor twisting flex circuitry substrate 22 so as to damage the resultant packaged electronic device, either cosmetically, mechanically, or electrically.

In step 70, interconnection bumps, typically solder balls, are formed.

In step 80, each ball grid array formed by the process discussed above is singulated, i.e. separated, from the carrier strip.

Figure 3:
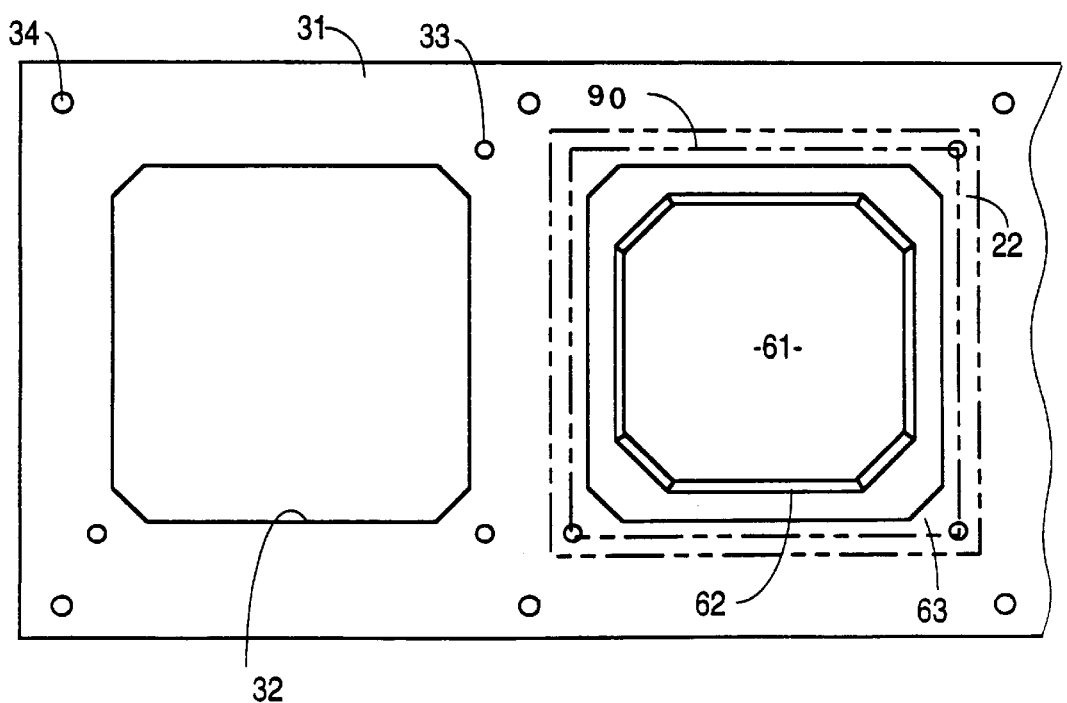
FIG. 3 is a plan view of a carrier strip showing on the right side a molded grid array package therein.

FIG. 3 is a plan view of a portion of a carrier strip 31 showing, on the left side, an octagonal carrier strip aperture 32 under which a flex circuitry substrate 22 is to be mounted. Carrier strip 31 typically copper, includes tooling holes 33 and 34. Tooling holes 33 are used to align flex circuitry substrate 22 against carrier strip 31 in an aperture overlying position. Tooling holes 34 are used to position carrier strip 31 on various apparatuses of standard manufacturing equipment, e.g. the mold or wire bonder, used in the production of a packaged electronic device such as a ball grid array (BGA). As seen on the right side of FIG. 3, one embodiment of an accepted flex circuitry substrate 22 has a 29 mm by 29 mm size.

Flex circuitry substrate 22 is positioned so as to underlie aperture 32 such that the substrate extends beyond holes 33.

Figure 7:
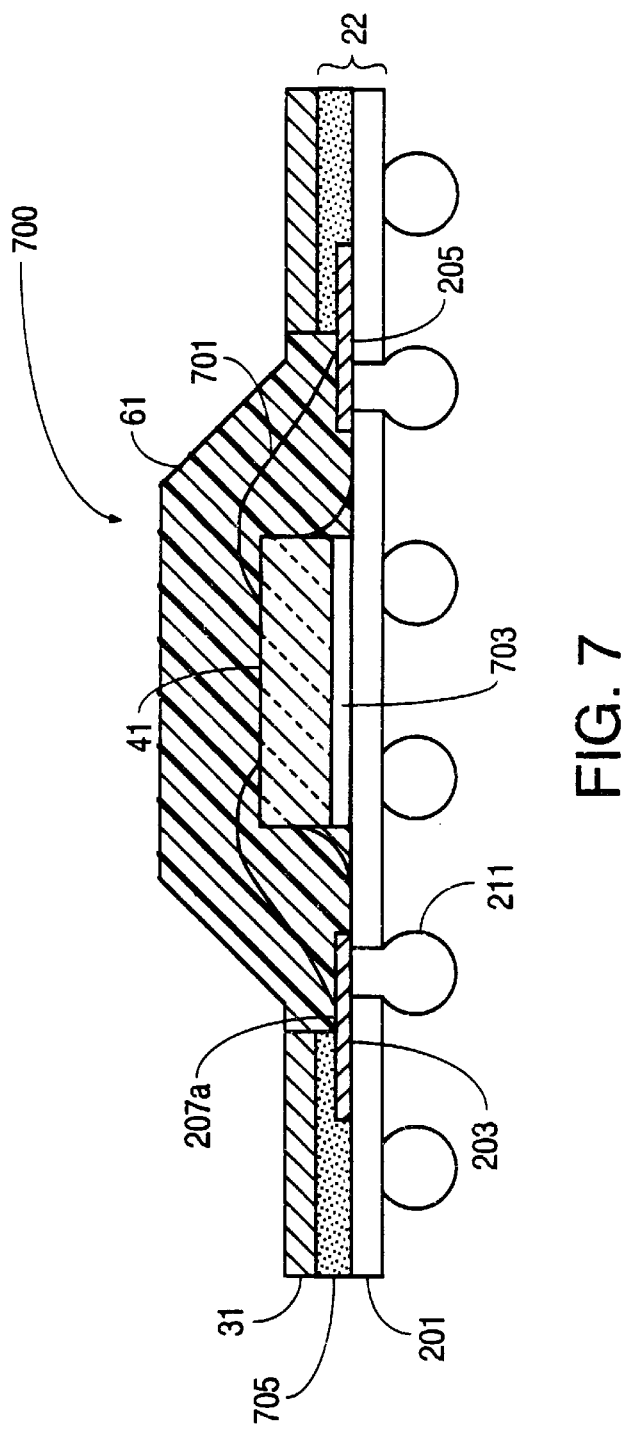
FIG. 7 is a schematic side view partially in cross-section showing the encapsulated die and wire bonds.

The flex circuitry substrate 22 is attached to carrier strip 31 by a suitable adhesive 705 (FIG. 7). In one embodiment, the aperture 32 is large enough such that all of the contact pads 205 are inside the aperture 32. This embodiment has the advantage that all of the critical circuitry will be covered by mold compound, which has excellent adhesion to the flex circuit 22. In another embodiment, the aperture 32 is small enough such that all of the contact pads 205 are covered by the carrier frame 31. In this embodiment, the carrier frame 31 can be used as a ground plane to improve electrical performance of the package. In one embodiment of the invention, adhesive 705 may be a double-sided adhesive tape suitable for the processing environment to which it will be subjected, such as "Lead Lock" tape from Brady Co. of Milwaukee, Wis. or comparable tape from Tomoegawa of Japan or Pyralux™ adhesive tape from DuPont Co.

After encapsulation to form molded body 61, a bevelled encapsulant edge 62 is formed encircling molded body 61 inside a mold shut off area 63. Upon singulation, i.e. separation, of the BGA from carrier strip 31 in step 80 (FIG. 1) the finished/completed BGA package will be a 27 mm by 27 mm square, with an attached portion of the carrier strip, as seen by the multi-dashed lines 64.

Figure 4:
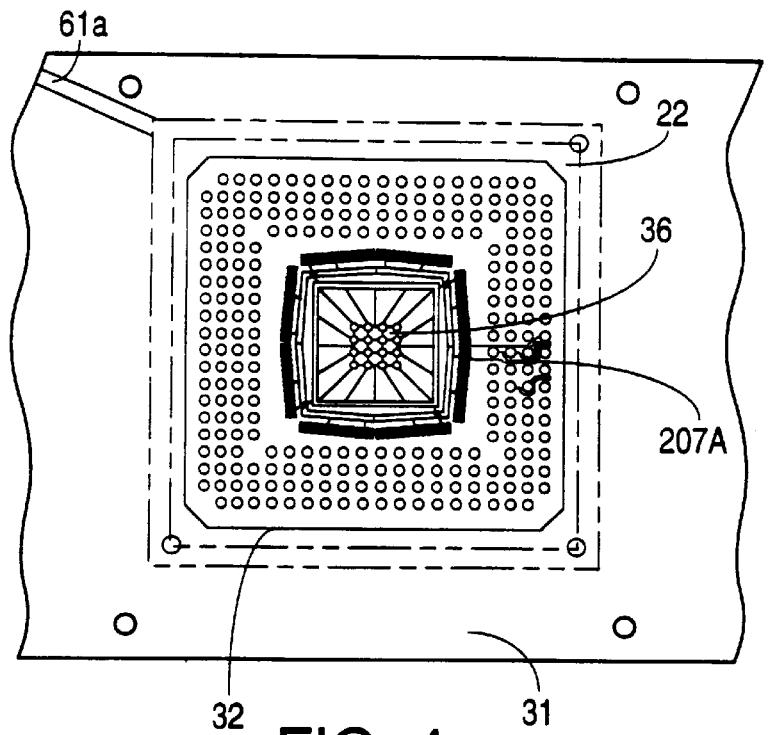
FIG. 4 is a plan view of a carrier strip section showing an obverse side of a mounted flex circuity substrate prior to die mounting, wire bonding and encapsulation.

FIG. 4 illustrates the mounting of flex circuitry substrate 22 overlying an aperture 32 of a series of apertures in carrier strip 31. A die attach area 36 is provided for mounting an integrated circuit die or electronic device. In one embodiment, metal traces and/or bonding positions 207A extend over the top surface of flex circuitry substrate 22 to vias through one or more flex circuitry levels. Only a small segment of the metallization 207A is shown in FIG. 4. Typically, the metallization extends completely around the periphery of substrate 22. In another embodiment, shown in FIG. 2A, there is only a single metal layer 203 and the "vias" to the contact pads 205 are simply holes 204 in the polyimide film 201

Figure 5:
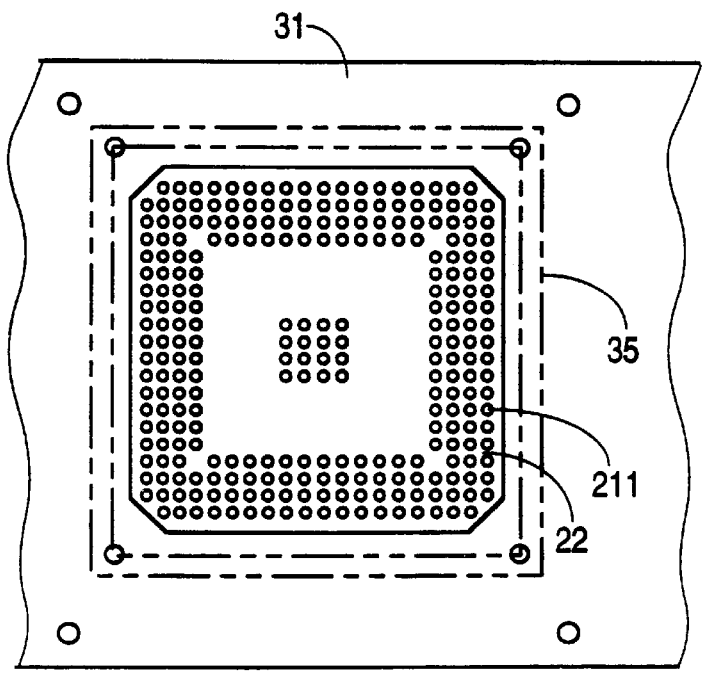
FIG. 5 is a plan view of a strip section showing a reverse side of the flex circuity substrate prior to forming ball bonds on an array of contact pads.

FIG. 5 shows the reverse or underside of the attached accepted flex circuitry substrate 22 where the edges of flex circuitry substrate 22 are shown by lines 35. Interconnect bumps 211 are later formed on contact pads 205 (FIG. 2B).

Figure 6:
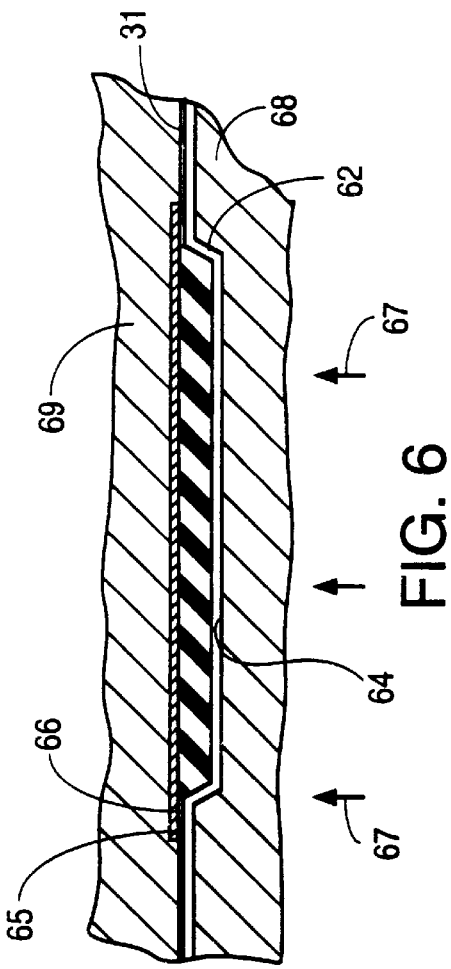
FIG. 6 is a schematic side view of a two-part mold die and cavity for encapsulating the grid array die and wire bonds.

FIG. 6 illustrates the auto-molding of a package body 61 by the action of a two-piece mold die 68 and 69 forming a cavity 64 which clamps against and around the periphery of the boundary surface edges 65 of the carrier strip apertures. The inner peripheral edges 66 of the carrier strip aperture act as a stop or dam for the encapsulant with the boundary surface edges 65 acting as a mechanical shut-off for the liquid molding compound, being dispensed into the mold die cavity 64.

Arrows 67 indicate clamping of mold die piece 68 against carrier strip 31 which is backed by a fixed mold die-supporting piece 69 during the clamping and encapsulating operations. When encapsulant is supplied into the cavity (with the top side of flex circuitry substrate 22 facing downwardly as shown in FIG. 6) a mold body 61, with or without a bevelled side edge 62, is formed upon hardening of the mold compound. A mold runner 61a (FIG. 4) extends from a mold supply inlet knot shown) to the mold cavity. For illustration purposes only, a non-existent gap is illustrated between the mold die 68 and the molded body 61. By molding against the carrier strip boundary surface edges, poor adhesion of the molding compound results and the compound does not tenaciously stick to carrier strip surfaces. However, it does stick to the flex circuit substrate 22.

The hardening molding compound is then hardened and the mold die piece 68 is un-clamped and opened to remove the molding runner from the strip carrier.

FIG. 7 illustrates the packaged assembly 700 resultant from step 70 where interconnecting bumps, e.g. solder balls 211, are formed on the contact pads 205 (FIG. 2A). FIG. 7 also illustrates the bonding of the die 41 to the substrate 201 by adhesive 703 and wire bonds 701 connecting die 41 to metallization 203.

In the singulation step 80, the finished BGA is separated out by punching.

An annular ring of copper around the carrier strip aperture remains to function as a ground plane, heat sink, and package stiffener to reduce package warpage.

The above description of embodiments of this invention is intended to be illustrative and not limiting. Other embodiments of this invention will be obvious to those skilled in the art in view of the above disclosure. Consequently, those of skill in the art will recognize many other applications of the invention that are within the scope and spirit of the invention as established by the appended claims.

We claim:

1. A method of making a grid array assembly including an integrated circuit die comprising:

providing an elongated carrier strip having a series of spaced aligned apertures extending longitudinally along the strip;

providing a flexible film having a die attach area and film metallization, including bonding pads on at least a first surface of the film, and contact pads on an opposite surface of the film, forming flex circuitry;

singulating the flex circuitry into individual substrates;

aligning the individual substrates with respect to ones of said strip apertures;

attaching peripheral edges of each of the substrates to said carrier strip;

mounting an integrated circuit die including die conductive pads, on said film die attach area;

bonding wire bonds from said die conductive pads to said film bonding pads;

encapsulating said die, said die conductive pads and a portion of said film overlapping said at least one aperture to produce a molded encapsulation;

providing interconnection bumps to said film metallization; and removing a resultant grid array assembly from the carrier strip, wherein a portion of said elongated carrier strip surrounding said apertures extends from said molded encapsulation and remains attached to said substrate such that said resultant grid array assembly is stiffened by said elongated carrier strip portion and provides a thermally conductive surface area exposed outside of the grid array assembly.

2. The method of claim 1 wherein said attaching comprises attaching each of said substrates to a 360° peripheral lateral edge surrounding one of the series of aligned apertures of said carrier strip.

3. The method of claim 2 wherein said film is a strip of plastic film including a series of flex circuits having a longitudinal spacing corresponding to the spacing of said carrier frame aligned apertures, and wherein said attaching comprises attaching marginal edges of each of said substrates to respective lateral edges of a series of carrier strip apertures.

4. The method of claim 1 wherein said encapsulating comprises providing a mold die including a molding cavity and a molding runner;

closing and clamping said mold die including the molding cavity and molding runner on a peripheral surface of the carrier strip overlying respective ones of said substrates;

transferring a hardenable molding compound into the molding cavity, around said die and said wire bonds, and onto said substrates;

hardening the molding compound; and un-clamping and opening said mold die to remove the molding runner from the strip carrier.

5. The method of claim 1 wherein said removing comprises singulating single grid array assemblies from said carrier strip.

6. The method of claim 5 wherein said singulating of single grid array assemblies comprises punching through an outer periphery of each of said substrates and then removing an assembly from a strip aperture.

7. The method of claim 1 wherein each interconnection bump is a solder ball on an array of contact pads on said film and electrically connected to the film metallization.

8. The method of claim 1 wherein the thermal expansion coefficient of the material of the flexible film is closely matched to the thermal expansion coefficient of the material of the carrier strip.

9. The method of claim 8 where the thermal coefficient of expansion of the flexible film and the carrier strip is in the range of 12–18 ppm/° C.

10. The method of claim 1 wherein the carrier strip is a nickel-plated steel, stainless steel, copper or brass.

11. The method of claim 1 wherein said attaching comprises using a non-conductive adhesive to attach said peripheral edges of each of said substrates to said carrier strip.

12. The method of claim 1 wherein said elongated carrier strip portion forms a ground plane with said metallization.

13. A method of making a grid array assembly, comprising:

providing a flex circuitry substrate having a bonding pad;

attaching said flex circuitry substrate to a carrier strip having an aperture, wherein said flex circuitry substrate covers said aperture;

coupling an integrated circuit die to said flex circuitry substrate, said integrated circuit die having a die conductive pad;

electrically coupling said die conductive pad to said bonding pad;

encapsulating said integrated circuit die, said die conductive pads and a portion of said flex circuitry substrate not covered by said carrier strip to from an encapsulation;

connecting an interconnection member to said flex circuitry substrate; and removing a resultant grid array assembly, including said flex circuitry substrate and said encapsulation, from said carrier strip, wherein a portion of said carrier strip surrounding said aperture remains attached to said flex circuitry substrate.

14. The method of claim 13 wherein said carrier strip has a greater stiffness than said flex circuitry substrate.

15. The method of claim 13 wherein said flex circuitry substrate comprises a plastic film having a die attach area, a film metallization, and a contact pad, wherein said interconnect member communicates with said contact pad.

16. The method of claim 15 wherein said carrier strip portion forms a ground plane with said metallization.

17. The method of claim 13 wherein said attaching comprises using a non-conductive adhesive to attach said flex circuitry substrate to said carrier strip.

18. The method of claim 13 wherein the thermal expansion coefficient of said flex circuit substrate is about equal to the thernmal expansion coefficient of said carrier strip.

19. The method of claim 13 wherein said flex circuitry substrate comprises a plurality of contact pads, wherein all of said plurality of contact pads are within said aperture when said flex circuitry substrate is attached to said carrier strip.

20. The method of claim 13 wherein said flex circuitry substrate comprises a plurality of contact pads, wherein said carrier strip covers all of said plurality of contact pads.

21. The method of claim 13 wherein said electrically coupling comprises bonding a wire from said die conductive pad to said bonding pad.

22. The method of claim 13 wherein said attaching comprises applying an adhesive to said carrier strip, aligning said flex circuitry substrate to said aperture, feeding said flex circuitry substrate on said carrier strip and laminating said flex circuitry substrate onto said carrier strip.

23. The method of claim 13 wherein said encapsulating comprises:

providing a mold die including a molding cavity and a mold runner;

engaging said mold die against said carrier strip, such that said mold die overlies said aperture;

supplying a molding compound into said molding cavity, wherein said molding compound covers said integrated circuit die, said die conductive pad and a portion of said flex circuitry substrate not covered by said carrier strip; and disengaging said mold die when said molding compound has hardened.

24. The method of claim 13 wherein said removing step comprises punching through an outer periphery of said carrier strip surrounding said aperture and removing said resultant grid assembly from said carrier strip.

25. The method of claim 13 wherein said carrier strip is a metallic strip.

26. The method of claim 25 wherein said metallic strip is copper.

* * * * *